(12) United States Patent
Couchman et al.

(10) Patent No.: US 8,004,356 B2
(45) Date of Patent: Aug. 23, 2011

(54) TUNING MULTIPORT AMPLIFIERS

(75) Inventors: Alan David Couchman, Hitchin (GB);
Daryl Richard Jones, Amersham (GB)

(73) Assignee: Astrium Limited, Hertfordshire (GB)

( * ) Notice: Subject to any disclaimer, the term of this patent is extended or adjusted under 35 U.S.C. 154(b) by 404 days.

(21) Appl. No.: 12/160,988

(22) PCT Filed: May 2, 2008

(86) PCT No.: PCT/GB2008/001554
§ 371 (c)(1),
(2), (4) Date: Jul. 15, 2008

(87) PCT Pub. No.: WO2008/135754
PCT Pub. Date: Nov. 13, 2008

(65) Prior Publication Data
US 2010/0214017 A1    Aug. 26, 2010

(30) Foreign Application Priority Data

May 4, 2007 (EP) .................................. 07251875
May 4, 2007 (GB) .................................. 0708721.6

(51) Int. Cl.
*H03F 3/68* (2006.01)
(52) U.S. Cl. ................. 330/124 D; 330/124 R
(58) Field of Classification Search ............... 330/124 R, 330/124 D, 295
See application file for complete search history.

(56) References Cited

U.S. PATENT DOCUMENTS

| 4,618,831 | A | * | 10/1986 | Egami et al. | ............... 330/124 R |
| 5,610,556 | A | * | 3/1997 | Rubin | ........................ 330/124 R |
| 5,955,920 | A | * | 9/1999 | Reudink et al. | ........... 330/124 R |
| 6,006,111 | A |   | 12/1999 | Rowland | |
| 6,243,038 | B1 |   | 6/2001 | Butler et al. | |
| 6,437,642 | B1 |   | 8/2002 | Razario | |

(Continued)

FOREIGN PATENT DOCUMENTS

EP    1 475 887 A2    11/2004

(Continued)

OTHER PUBLICATIONS

Egami, Shunichiro et al., "An Adaptive Multiple Beam System Concept", IEEE Journal on Selected Areas in Communications, IEEE Service Center, Piscataway, New Jersey, U.S., vol. SAC-5, No. 4, May 1987, pp. 630-636.

(Continued)

*Primary Examiner* — Khanh V Nguyen
(74) *Attorney, Agent, or Firm* — Pearl Cohen Zedek Latzer, LLP (57) ABSTRACT

A method of tuning a multiport amplifier and a multiport amplifier are provided. The multiport amplifier comprises an even number of microwave power amplifiers arranged in parallel, a series of input ports and a series of output ports, the input ports being connected to the amplifiers by a series of input hybrids and the output ports being connected to the amplifiers by a series of output hybrids, whereby an input signal at any given input port is amplified by all amplifiers, and then recombined into an output signal at a given output port. The method includes the steps of matching each amplifier in a pair of adjacent amplifiers to the other to an extent which is greater than matching between non paired amplifiers while still being able to ensure acceptable signal isolation between all output ports. This method of tuning results in an MPA well suited to the requirements of certain frequency re-use schemes and which has a significantly reduced set-up and test time.

28 Claims, 2 Drawing Sheets

U.S. PATENT DOCUMENTS 7,088,173 B1 8/2006 Rozario et al.
2004/0222849 A1* 11/2004 Doi .......................... 330/124 R

FOREIGN PATENT DOCUMENTS

WO    WO 2006/060114 A1    6/2006

OTHER PUBLICATIONS

Yamamoto, Kazuichi et al., "HPA Arrangement Method to Improve Isolation among Output Ports on a Multiport Amplifier", Electronics and Communications in Japan, Part I—Communications, Wiley, Hoboken, New Jersey, U.S., vol. 75, No. 3, Mar. 1, 1992, pp. 95-104.

UK Intellectual Property Office, Search Report under Section 17(5) for GB Application No. 0708721.6, Aug. 30, 2007, pp. 1-4.

European Patent Office, European Search Report for Application No. EP 07 25 1875.6, Oct. 2, 2007, pp. 1-7.

International Preliminary Report on Patentability for International Application No. PCT/GB2008/001554 issued Nov. 10, 2009.

* cited by examiner

TUNING MULTIPORT AMPLIFIERS

CROSS-REFERENCE TO RELATED APPLICATIONS

This application is a national phase application of PCT/GB2008/001554 filed on May 2, 2008, which in turn claims priority from GB Application No. 0708721.6 and EP Application No. 07251875.6, both filed on May 4, 2007, each of which are incorporated by reference herein in their entirety.

FIELD OF THE INVENTION

The present invention relates to tuning multiport amplifiers (MPAs) and in particular to adjusting the phase and gain relationship between individual amplifiers in an MPA to optimise signal isolation between output ports of the MPA.

BACKGROUND ART

An MPA is a well-known power amplifier device used for satellite communications, which may operate at microwave frequencies above 1 GHz, and covering L & S bands with frequencies in the range of 1.5-2.6 GHz, and Ku & Ka bands with frequencies in the region 12-20 GHz, etc.

An MPA includes a number N of similar amplifier units (TWT or solid state) in parallel, each having a power P, so that each input signal is amplified by each amplifier, to increase the power of each output signal by a factor N, to P×N. N input ports and N output ports are provided, so that an input signal on one input port is routed to the corresponding output port. The input ports are connected to the amplifier units by a low power input network (INET) that may be implemented in any convenient transmission line technology that is appropriate to the circumstances, e.g. microstrip, stripline, coaxial cable, or waveguide, and the output ports are connected to the amplifier units by a high power output network (ONET) that is implemented typically using low loss transmission line technology. The ONET is mathematically a reciprocal of the INET, so that a signal presented to the nth input is directed to the nth output. Each network comprises an array of signal dividing waveguide devices. A Butler matrix or a network comprising just hybrid devices are normally used for signal division, because they have convenient gain and phase shift properties. One type of hybrid is a four port signal dividing device comprising two inputs and two outputs, with selective 90° phase shifts; this phase difference may be exploited to improve the isolation characteristics of the networks. However other hybrids and other signal splitting devices may be used which may have 180° phase difference.

The invention is discussed in particular with regard to 8 port MPAs that may have use in Wideband Multi-beam payloads operating at Ku or Ka-band. These typically use Single Feed per Beam (SFB) designs which provide a contiguous set of up to 100 narrow beams or more over a defined area. MPAs are an attractive solution to SFBs, since they potentially offer a high degree of flexibility in allocating power to beam. MPAs have successfully been applied at L and S-band, but present highly challenging problems at Ku and Ka-band at which wavelengths are an order of magnitude shorter. We examine the impacts of mismatches on MPA performances, and identify a feature through which these impacts may be lessened, particularly with regard to isolation.

MPAs have been considered for use in multi-beam satellite payloads for some time, see S. Egami and M. Kawai: "An Adaptive Multiple Beam System Concept" IEEE Journal on Selected Areas in Communications, Vol. SAC5, No. 4, May 1987. They have been successfully employed at L-band, see M. Mallison, R. Gill, S. Curtis, R. Manku, "Advanced Payload for Multibeam Satellites that Support High Data Rate Broadband Global Area Network", AIAA, $23^{rd}$ International Communications Satellite Systems Conference, Rome, September 2005, and at S-band, see M. Tanaka and K. Yamamoto, "New Technologies in N-STAR Communications Payload", AIAA, $17^{th}$ International Communications Satellite Systems Conference, Yokohama, February 1998, primarily for mobile services.

More recently, with increasing interest in provision of broadband services, such as internet access and HDTV via multi-beam satellites, attention has focused on the provision of MPAs at Ku and Ka bands, see. R. Kuramasu, T. Araki, M. Shimada, E. Tomita, T. Satoh, T. Kuroda, M. Yajima, T. Maeda, T. Mukai, "The Wideband Internetworking Engineering Test and Demonstration Satellite (WINDS)", AIAA, $20^{th}$ International Communications Satellite Systems Conference, Montreal, May 2002, and A. Anakabe, A. Mallet, F. Gizard, C. Laporte, T. Robert, C. Boulanger, J. Sombrin, L. Lapierre, P. Barretto-Da-Rocha, P. Frichot, F. Coromina, J. Collantes, "Ka-band Multi-port Amplifier Characteristics for Space Telecommunication Operation", $6^{th}$ International Vacuum Electronics Conference, Noordwijk, Netherlands, April, 2005.

The most efficient multi-beam payload is a Single Feed per Beam (SFB) architecture which typically uses 3 or 4 antennas to generate a regular set of contiguous beams. These beams employ a high degree of frequency re-use, for example using a 4 frequency "colour" re-use scheme. The essential disadvantage of the SFB is lack of flexibility, particularly power to beam allocation. The application of MPAs would provide this flexibility, significantly enhancing the utility of this architecture by enabling capacity (transmitted power) to follow dynamically changes in demand across the coverage area. MPAs could be used in wideband, variable bandwidth transponders providing flexible assignment of power as well as bandwidth to each beam, ensuring optimum link performance in each case. The variable bandwidth may be provided using either analogue or digital signal processing.

In essence an MPA comprises an input Butler matrix, or network of just hybrids with $2^N$ (N=1, 2 ... etc), signal inputs, and provides access for each of these inputs equally to the same number ($2^N$), of amplifiers. The output of the amplifiers is fed to another Butler matrix or set of hybrids which mirrors the configuration of the input network, and which recombines the amplifier outputs into the same original signal set, but amplified. The great advantage of the MPA is that in providing access for each input port equally to each amplifier, the accessible power available to each port is $2^N \times P$, where P is the power of each individual amplifier. Thus the MPA embodies a high degree of flexibility, providing a wide range of output power which can be shared dynamically and in a highly flexible manner between the $2^N$ inputs.

The essential problem in the provision of Ku and Ka band MPAs is that of phase and amplitude tracking between the amplifiers and other units at the frequencies concerned (12 GHz at Ku, 20 GHz at Ka-band) and impacts of this tracking on interport isolation performance (the so-called cross talk problem).

The impacts of amplitude/phase mismatches on MPA performances are examined in detail, and a design feature/setup has been found through which mismatch impacts may be lessened, particularly with regard to isolation. Formulae and signal flow diagrams illustrate how MPAs may be optimized for multi-beam payloads, providing best isolation between ports of the same beam "colour". The analysis is with reference in particular to MPAs with 8 ports using INETs and ONETs comprised exclusively of hybrids, which is the configuration commonly of most interest. However, because of the symmetrical nature of MPAs, and their scalability, the analytical basis is applicable to any order and for schemes embodying Butler matrix INETs/ONETs in general. Currently 4 and 8-port MPAs are in use. MPAs having more than 16 ports may not find favour, owing to design complexity, although the invention will be of increasing value the more complex the MPA.

According to a first aspect of the invention there is provided a method of tuning a multiport amplifier, the multiport amplifier comprising an even number of power amplifiers arranged in parallel and each amplifier being paired with another amplifier, a series of input ports and a series of output ports, the input ports being connected to the amplifiers by a signal dividing network and the output ports being connected to the amplifiers by a signal combining network, whereby an input signal at any given input port is amplified by all amplifiers and then recombined into an output signal at a given output port, the method including the step of matching signal phase and gain of each amplifier to signal phase and gain of its paired amplifier to an extent which is more stringent than said matching between non paired amplifiers.

In the context of usage on satellites and for other communications uses, the power amplifiers will normally be microwave power amplifiers.

Conventional tuning involves matching of all amplifiers to the same degree of accuracy and is an iterative process involving the gain and phase adjustment of each amplifier until the same required isolation is achieved at all output ports for a given input port. This involves, at each iteration, measuring the phase and gain values at all output ports with each input port excited in sequence (ie a total of 2×8×8 measurements (phase and gain) at each iteration for an 8 port MPA). Moreover there may be a number of stages to the tuning, such as ensuring the required performance at ambient, hot and cold temperatures. Thus any configuration of the MPA which results in reduced isolation requirements at some ports with a corresponding reduction in amplifier tuning will provide significant savings in time and cost.

It has been estimated that the method of the invention, requiring only partial matching of amplifiers and hybrids, as it does, is likely to be 20-30% more time efficient in tuning.

The said step of matching each amplifier to its paired amplifier is preferably carried out by said matching of amplifiers paired adjacent one another.

Each of these HPA pairs, with their associated hybrids are preferably integrated together as self-contained units and preferably with a common power supply for each unit.

The signal dividing and signal combining networks may each include a series of respective signal dividing and signal combining hybrids and in which the said step of matching paired amplifiers adjacent one another also includes matching signal phase and insertion losses for respective input and output hybrids in closest connection with each said pair of amplifiers.

Where each amplifier pair is an adjacent amplifier pair, that pair and the respective input and output hybrids in closest connection therewith may comprise a self contained assembly with a common power supply.

The said step of matching each amplifier to its paired amplifier may be carried out by said matching of paired alternate amplifiers. Where this is the case the said step of matching the paired alternate amplifiers may also include matching signal phase and insertion losses for respective input and output hybrids in both closest connection and next closest connection with each paired amplifier.

Matching each amplifier to its paired amplifier may also be carried out by matching of amplifiers paired at every $4^{th}$ position. When this is done and if the signal dividing and signal combining networks each include a series of respective signal dividing and signal combining hybrids the step of matching the paired amplifiers may also include matching signal phase and insertion losses for respective input and output hybrids in the closest connection, the second closest connection and the third closest connection with each paired amplifier.

The step of matching signal phase and gain of each amplifier to signal phase and gain of its paired amplifier may be carried out substantially to within 10 to 15 degrees of signal phase and 1.0 to 2 dB of gain, more stringently, substantially to within 7 to 10 degrees of signal phase and 0.7 to 1.0 dB of gain, more stringently still, substantially to within 5 to 7 degrees of signal phase and 0.5 to 0.7 dB of gain, If even better matching is required in certain circumstances, then matching substantially to within less than 5 degrees of signal phase and less than 0.5 dB of gain may be obtained. It will be appreciated that this will be more time consuming than obtaining the more relaxed matching of the previous three ranges but, in all cases, it is only the paired amplifiers that are matched to the closer limits and in many cases the non paired amplifiers may require no adjustment at all from their manufactured state. Thus the step of matching said non paired amplifiers may take place substantially to between 15 to 20 degrees of signal phase and 1.5 to 2.5 dB of gain.

All hybrids may be matched to at least substantially 10 degrees of signal phase and 1 dB of insertion loss.

Deviation from 90 degrees phase difference between hybrid output ports may be set to at least substantially 5 degrees and insertion loss tracking between hybrid input and output ports to at least substantially 0.3 dB.

Matching between each amplifier in an adjacent pair to at least 10 degrees of signal phase and 1.0 dB will provide a minimum of 24 dB isolation for an SFB architecture operating with four frequency colour re-use. If to at least 7 degrees of signal phase and 0.7 dB, 26 dB isolation will be provided for the same architecture with the 2 dB margin to guard against ageing and thermal variations. Matching to an extent closer than this, for example to at least 5 degrees of signal phase and 0.5 dB, may be preferable, for example, in an SFB architecture operating with four colour re-use and with carriers differing significantly in power. But it will of course be more difficult, and therefore more expensive, to achieve.

Good matching is also required between non-adjacent HPAs to ensure acceptable isolation between ports of different colour and acceptable combining efficiency, but not to the same extent as for isolation between ports of the same colour. Worked examples providing isolation estimates and combining efficiency are presented. These are confirmed through MPA simulations.

Matching of paired alternate amplifiers may be applied (for MPAs with $\geq 4$ ports), of every $4^{th}$ amplifier (for MPAs with A ports), of every $8^{th}$ amplifier (for MPAs with $\geq 16$ ports), etc. Again, this matching will be to an extent which is more stringent than matching between the non paired amplifiers.

According to a second aspect of the invention there is provided a multiport amplifier comprising an even number of power amplifiers arranged in parallel and each amplifier being paired with another amplifier, a series of input ports and a series of output ports, the input ports being connected to the amplifiers by a signal dividing network and the output ports being connected to the amplifiers by a signal combining network, whereby an input signal at any given input port is amplified by all amplifiers and then recombined into an output signal at a given output port, the multiport amplifier being tuned according to the method of the first aspect of the invention.

The signal dividing and combining networks may each comprise an 8×8 Butler matrix.

The signal dividing network may alternatively include a series of signal dividing hybrids with the signal combining network including a series of signal combining hybrids.

The multiport amplifier may comprise 8 ports and the signal dividing and combining networks may each comprise three columns of hybrids equivalent to a Butler matrix without the inter-hybrid phase shifters. The first four input ports may each be connected to a different non-overlapping frequency band with the second four input ports being each connected to one of the same four frequency bands.

In an alternative embodiment the first four input ports are alternately connected to two different non-overlapping frequency bands and the second four input ports are each connected to two different non-overlapping frequency bands with the two frequency bands for the first set of four input ports being different from those of the second set.

In a further alternative embodiment pairs of adjacent input ports are connected to bands of the same frequency, with each pair being connected to one of four different non-overlapping bands of frequency.

Each output port may be connected to a respective antenna feed of a single feed per beam, multi-beam antenna whereby to form a set of beams with frequencies in accordance with a defined frequency re-use pattern.

The isolation analysis presented herein enables output port selection for optimum isolation in multi-beam frequency re-use schemes and the IM analysis assists in the allocation of frequencies to input ports for minimum IM interference.

BRIEF DESCRIPTION OF THE DRAWINGS

The invention will now be described by example with reference to the following drawings of which:—

DESCRIPTION OF THE PREFERRED EMBODIMENT

Figure 1:
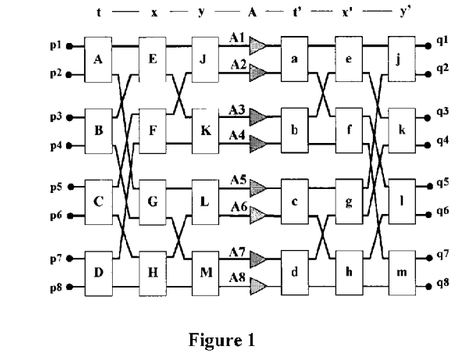
FIG. 1 is a diagrammatic representation of an 8-port MPA using INETs and ONETs constructed exclusively from hybrids rather than a Butler matrix, which embodies both hybrids and phase shifters.

A diagram of an 8 port MPA is shown FIG. 1. It comprises a set of 3 columns of 4 input hybrids, a single column of 8 amplifiers and a set of 3 columns of 4 output hybrids.

Figure 2:
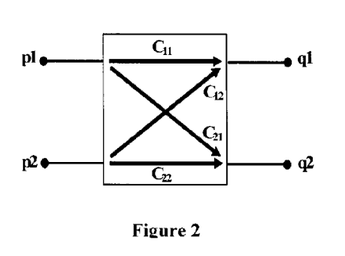
FIG. 2 is a diagrammatic representation of a hybrid as used in the present invention.

A definition of a hybrid element (input or output hybrid), is given in FIG. 2. The input and output signals, $p_1$ & $p_2$ and $q_1$ & $q_2$ are assumed to be complex. Transfer function of the hybrid is represented thus:

$$\begin{pmatrix} q1 \\ q2 \end{pmatrix} = \begin{pmatrix} C_{11} & C_{12} \\ C_{21} & C_{22} \end{pmatrix} \begin{pmatrix} p1 \\ p2 \end{pmatrix} \qquad (1)$$

where $C_{11}$, $C_{12}$, $C_{21}$, $C_{22}$ are all invariable complex coefficients which can be represented as follows:

$$C_{11}=r_{11} \cdot \exp j \cdot \theta_{11},\ C_{12}=j \cdot r_{12} \cdot \exp j \cdot \theta_{12},$$
$$C_{21}=j \cdot r_{21} \cdot \exp j \cdot \theta_{21},\ C_{22}=r_{22} \cdot \exp j \cdot \theta_{22} \qquad (2)$$

Ideally for a perfect hybrid all $r=1/\sqrt{2}$, and all $\theta=0$, and the transfer matrix becomes:

$$T = 1/\sqrt{2} \begin{pmatrix} 1 & j \\ j & 1 \end{pmatrix} \qquad (3)$$

For a practical hybrids, r and $\theta$ will deviate from the ideal, and if the deviations are small ($\sqrt{2}/r<0.2$ dB, $\theta<10°$) the following approximations can be made:

$$C_{11}=(\alpha/\sqrt{2})(1+\sigma_{11}+j \cdot \theta_{11}),\ C_{12}=j(\alpha/\sqrt{2})(1+\sigma_{12}+j \cdot \theta_{12}) \qquad (4)$$

$$C_{21}=j(\alpha/\sqrt{2})(1+\sigma_{21}+j \cdot \theta_{21}),\ C_{22}=(\alpha/\sqrt{2})(1+\sigma_{22}+j \cdot \theta_{22}) \qquad (5)$$

where $\alpha$ is a loss factor common to all input or output hybrids (between 0.2 dB to 0.7 dB, depending, for example on whether the hybrid is in waveguide or coax), and $\sigma$ & $\theta$ are respectively amplitude and phase deviations from the nominal (nom.=1.0 & 0° respectively for amplitude and phase)

For the analysis, the amplifiers are assumed to be perfectly linear with complex gain G, represented by function, $$A = G \cdot \exp j \cdot \varnothing \qquad (6)$$

As discussed above, and ideally in a MPA transponder, all amplifiers will be matched and have the same value of G and $\varnothing$. However for practical amplifiers there will be a deviation $\Delta$ and $\delta$ with respect to some mean gain and phase shift value $G_o$ and $\varnothing_o$ respectively. For small deviations ($\Delta<0.5$ dB, $\delta<10°$) the gain function can be written as:

$$A = G_o \cdot (1+\Delta+j \cdot \delta) \cdot \exp j \cdot \varnothing_o \qquad (7)$$

The total transfer matrix of the MPA is given by:

$$\phi = y'' \cdot x''' \cdot t' \cdot A \cdot y \cdot x \cdot t,\ \text{or}\ \phi = \Gamma \cdot A \cdot \Omega \qquad (8)$$

where t, x & y are the transfer matrices of the first, second and third input hybrid column (with a combined overall transfer function $\Omega$), and t', x' & y' those of the corresponding output hybrid columns (combined overall transfer function $\Gamma$) as defined in FIG. 1.

The matrix representations for each column of input hybrids are presented below. The letter subscripts against the hybrid transfer coefficients correspond to the hybrid letter designations shown in FIG. 1.

$$t = \begin{pmatrix} C_{11A} & C_{12A} & 0 & 0 & 0 & 0 & 0 & 0 \\ C_{21A} & C_{22A} & 0 & 0 & 0 & 0 & 0 & 0 \\ 0 & 0 & C_{11B} & C_{12B} & 0 & 0 & 0 & 0 \\ 0 & 0 & C_{21B} & C_{22B} & 0 & 0 & 0 & 0 \\ 0 & 0 & 0 & 0 & C_{11C} & C_{12C} & 0 & 0 \\ 0 & 0 & 0 & 0 & C_{21C} & C_{22C} & 0 & 0 \\ 0 & 0 & 0 & 0 & 0 & 0 & C_{11D} & C_{12D} \\ 0 & 0 & 0 & 0 & 0 & 0 & C_{21D} & C_{22D} \end{pmatrix} \quad (9)$$

$$x = \begin{pmatrix} C_{11E} & 0 & C_{12E} & 0 & 0 & 0 & 0 & 0 \\ C_{12E} & 0 & C_{22E} & 0 & 0 & 0 & 0 & 0 \\ 0 & 0 & 0 & 0 & C_{11F} & 0 & C_{12F} & 0 \\ 0 & 0 & 0 & 0 & C_{21F} & 0 & C_{22F} & 0 \\ 0 & C_{11G} & 0 & C_{12G} & 0 & 0 & 0 & 0 \\ 0 & C_{21G} & 0 & C_{22G} & 0 & 0 & 0 & 0 \\ 0 & 0 & 0 & 0 & 0 & C_{11H} & 0 & C_{12H} \\ 0 & 0 & 0 & 0 & 0 & C_{21H} & 0 & C_{22H} \end{pmatrix}$$

$$y = \begin{pmatrix} C_{11J} & 0 & C_{12J} & 0 & 0 & 0 & 0 & 0 \\ C_{21J} & 0 & C_{22J} & 0 & 0 & 0 & 0 & 0 \\ 0 & C_{11K} & 0 & C_{12K} & 0 & 0 & 0 & 0 \\ 0 & C_{21K} & 0 & C_{22K} & 0 & 0 & 0 & 0 \\ 0 & 0 & 0 & 0 & C_{11L} & 0 & C_{12L} & 0 \\ 0 & 0 & 0 & 0 & C_{12L} & 0 & C_{22L} & 0 \\ 0 & 0 & 0 & 0 & 0 & C_{11M} & 0 & C_{12M} \\ 0 & 0 & 0 & 0 & 0 & C_{21M} & 0 & C_{22M} \end{pmatrix}$$

Those for the output hybrid set are presented below:

$$t' = \begin{pmatrix} C_{11a} & C_{12a} & 0 & 0 & 0 & 0 & 0 & 0 \\ C_{21a} & C_{22a} & 0 & 0 & 0 & 0 & 0 & 0 \\ 0 & 0 & C_{11b} & C_{12b} & 0 & 0 & 0 & 0 \\ 0 & 0 & C_{21b} & C_{22b} & 0 & 0 & 0 & 0 \\ 0 & 0 & 0 & 0 & C_{11c} & C_{12c} & 0 & 0 \\ 0 & 0 & 0 & 0 & C_{21c} & C_{22c} & 0 & 0 \\ 0 & 0 & 0 & 0 & 0 & 0 & C_{11d} & C_{12d} \\ 0 & 0 & 0 & 0 & 0 & 0 & C_{21d} & C_{22d} \end{pmatrix} \quad (10)$$

$$x' = \begin{pmatrix} C_{11e} & 0 & C_{12e} & 0 & 0 & 0 & 0 & 0 \\ C_{21e} & 0 & C_{22e} & 0 & 0 & 0 & 0 & 0 \\ 0 & C_{11f} & 0 & C_{12f} & 0 & 0 & 0 & 0 \\ 0 & C_{21f} & 0 & C_{22f} & 0 & 0 & 0 & 0 \\ 0 & 0 & 0 & 0 & C_{11g} & 0 & C_{12g} & 0 \\ 0 & 0 & 0 & 0 & C_{21g} & 0 & C_{22g} & 0 \\ 0 & 0 & 0 & 0 & 0 & C_{11h} & 0 & C_{12h} \\ 0 & 0 & 0 & 0 & 0 & C_{21h} & 0 & C_{22h} \end{pmatrix}$$

$$y' = \begin{pmatrix} C_{11j} & 0 & 0 & 0 & C_{12j} & 0 & 0 & 0 \\ C_{21j} & 0 & 0 & 0 & C_{22j} & 0 & 0 & 0 \\ 0 & C_{11k} & 0 & 0 & 0 & C_{12k} & 0 & 0 \\ 0 & C_{21k} & 0 & 0 & 0 & C_{22k} & 0 & 0 \\ 0 & 0 & C_{11l} & 0 & 0 & 0 & C_{12l} & 0 \\ 0 & 0 & C_{12l} & 0 & 0 & 0 & C_{22l} & 0 \\ 0 & 0 & 0 & C_{11m} & 0 & 0 & 0 & C_{12m} \\ 0 & 0 & 0 & C_{21m} & 0 & 0 & 0 & C_{22m} \end{pmatrix}$$

With ideal hybrids, ie all $C_{11}, C_{22}=1/\sqrt{2}$ and all $C_{12}, C_{21}=j/\sqrt{2}$, and assuming unity gain, zero phase shift amplifiers, the overall transfer matrix is then as given by Eq. (11):

$$\Phi = \Gamma \cdot \Omega = \begin{pmatrix} 0 & 0 & 0 & 0 & 0 & 0 & 0 & -j \\ 0 & 0 & 0 & 0 & 0 & 0 & -j & 0 \\ 0 & 0 & 0 & 0 & 0 & -j & 0 & 0 \\ 0 & 0 & 0 & 0 & -j & 0 & 0 & 0 \\ 0 & 0 & 0 & -j & 0 & 0 & 0 & 0 \\ 0 & 0 & -j & 0 & 0 & 0 & 0 & 0 \\ 0 & -j & 0 & 0 & 0 & 0 & 0 & 0 \\ -j & 0 & 0 & 0 & 0 & 0 & 0 & 0 \end{pmatrix} \quad (11)$$

thus $q1=-jp8$, $q2=-jp7$ ... etc.

When practical values of $C_{11}$, $C_{22}$, $C_{12}$, $C_{21}$ and A are assumed, the full matrix representation of $\Phi$ becomes mathematically unwieldy. To illustrate specific properties of the MPA transfer function, a selection of elements from this matrix are presented below. These all relate to I/P port 1, but the general characteristics displayed by the selection of equations would be equally applicable to any other I/P port.

$$\Phi_{11} = C_{11A} \cdot C_{11j} \cdot [C_{11E} \cdot C_{11e} \cdot (A_1 \cdot C_{11J} \cdot C_{11a} + A_2 \cdot C_{21J} \cdot C_{12a}) + C_{21E} \cdot C_{12e} \cdot (A_3 \cdot C_{11K} \cdot C_{11b} + A_4 \cdot C_{21K} \cdot C_{12b})] + C_{21A} \cdot C_{12j} \cdot [C_{11G} \cdot C_{11g} \cdot (A_5 \cdot C_{11L} \cdot C_{11c} + A_6 \cdot C_{21L} \cdot C_{12c}) + C_{21G} \cdot C_{12g} \cdot (A_7 \cdot C_{11M} \cdot C_{11s} + A_8 \cdot C_{21M} \cdot C_{12d})] \quad (12)$$

$$\Phi_{41} = C_{11A} \cdot C_{21k} \cdot [C_{11E} \cdot C_{21e} \cdot (A_1 \cdot C_{11J} \cdot C_{11a} + A_2 \cdot C_{21J} \cdot C_{12a}) + C_{21E} \cdot C_{22e} \cdot (A_3 \cdot C_{11K} \cdot C_{11b} + A_4 \cdot C_{21K} \cdot C_{12b})] + C_{21A} \cdot C_{22k} \cdot [C_{11G} \cdot C_{21g} \cdot (A_5 \cdot C_{11L} \cdot C_{11c} + A_6 \cdot C_{21L} \cdot C_{12c}) + C_{21G} \cdot C_{22g} \cdot (A_7 \cdot C_{11M} \cdot C_{11d} + A_8 \cdot C_{21M} \cdot C_{12d})] \quad (13)$$

$$\Phi_{51} = C_{11A} \cdot C_{11l} \cdot [C_{11E} \cdot C_{11f} (A_1 \cdot C_{11J} \cdot C_{21a} + A_2 \cdot C_{21J} \cdot C_{22a}) + C_{21E} \cdot C_{12f} (A_3 \cdot C_{11K} \cdot C_{21b} + A_4 \cdot C_{21K} \cdot C_{22b})] + C_{21A} \cdot C_{12l} \cdot [C_{11G} \cdot C_{11h} \cdot (A_5 \cdot C_{11L} \cdot C_{21c} + A_6 \cdot C_{21L} \cdot C_{22c}) + C_{21G} \cdot C_{12h} \cdot (A_7 \cdot C_{11M} \cdot C_{21d} + A_8 \cdot C_{21M} \cdot C_{22d})] \quad (14)$$

$$\Phi_{71} = C_{11A} \cdot C_{11m} \cdot [C_{11E} \cdot C_{21f} (A_1 \cdot C_{11J} \cdot C_{21a} + A_2 \cdot C_{21J} \cdot C_{22a}) + C_{21E} \cdot C_{22f} (A_3 \cdot C_{11K} \cdot C_{21b} + A_4 \cdot C_{21K} \cdot C_{22b})] + C_{21A} \cdot C_{12m} \cdot [C_{11G} \cdot C_{21h} \cdot (A_5 \cdot C_{11L} \cdot C_{21c} + A_6 \cdot C_{21L} \cdot C_{22c}) + C_{21G} \cdot C_{22h} \cdot (A_7 \cdot C_{11M} \cdot C_{21d} + A_8 \cdot C_{21M} \cdot C_{22d})] \quad (15)$$

$$\Phi_{81} = C_{11A} \cdot C_{21m} \cdot [C_{11E} \cdot C_{21f} (A_1 \cdot C_{11J} \cdot C_{21a} + A_2 \cdot C_{21J} \cdot C_{22a}) + C_{21E} \cdot C_{22f} (A_3 \cdot C_{11K} \cdot C_{21b} + A_4 \cdot C_{21K} \cdot C_{22b})] + C_{21A} \cdot C_{22m} \cdot [C_{11G} \cdot C_{21h} \cdot (A_5 \cdot C_{11L} \cdot C_{21c} + A_6 \cdot C_{21L} \cdot C_{22c}) + C_{21G} \cdot C_{22h} \cdot (A_7 \cdot C_{11M} \cdot C_{21d} + A_8 \cdot C_{21M} \cdot C_{22d})] \quad (16)$$

$\Phi_{11}$ (Eqn. 12) represents the signal level at I/P port 1, appearing at O/P port 1, $\Phi_{51}$ (Eqn. 14), at O/P port 4, etc.

For an ideal system, $\Phi_{11}$ through to $\Phi_{71}$, should=0 (perfect isolation), with $\Phi_{81}=-j$. However, practical components result in finite isolations between ports.

Figure 3:
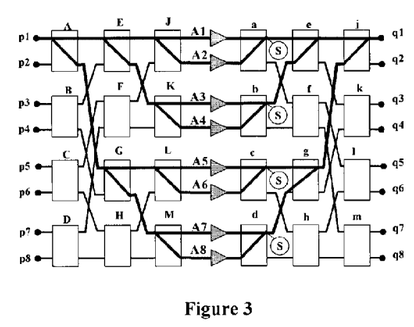
FIG. 3 is a diagram of signal flow in an 8-port MPA, showing null signal points for matched adjacent pairs of amplifiers.
Figure 4:
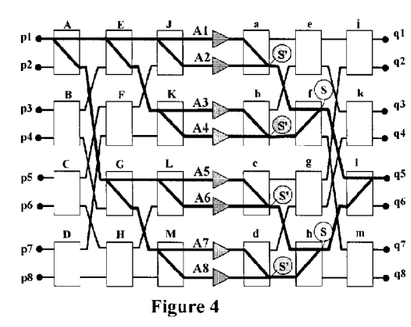
FIG. 4 is a diagram of alternative signal flow in an MPA, showing alternative null signal points for matching of alternate pairs of amplifiers.

Inspection of the above formulae demonstrates the following:

$\Phi_{11}$, $\Phi_{41}$ (also applies to $\Phi_{31}$ & $\Phi_{41}$, not shown): the isolations at the corresponding O/P ports are determined, according to the invention, to a first order of approximation, by matching between pairs of adjacent amplifiers ($A_1/A_2$, $A_3/A_4$ ... etc), and the quality (insertion loss differential and deviation from 90° between O/P ports) of the inner most hybrids J, K, L & M and a, b, c & d. This property is shown through the underlining of the relevant factors in Eqs. 12 and 13 and the signal flow diagram in FIG. 3. The flow diagram shows that with matching between adjacent amplifiers and their associated hybrids, self cancellation of the signal occurs at the O/Ps of the inner most output hybrids (at points S). This effect can be explained with reference for example to the amplifier pair $A_5/A_6$ with the signal input at port $p_1$. In the case of amplifier $A_6$, the relative phase shift from the input of the closest input hybrid (L) to the output of the closest output hybrid (c) will be 180° more than the phase shift between the same ports via $A_5$. This phase difference is introduced by the two 90° shifts produced by the hybrids either side of the amplifier pair, and results in the cancellation as indicated Thus the quality of the middle and outer hybrids has insignificant impact on isolation in these cases. In fact for these cases, for best match and hence isolation, the amplifier pairs and associated hybrids (eg A5/A6 with hybrids L & c), may be constructed as integrated assemblies $\Phi_{51}$ (also applies to $\Phi_{61}$, not shown). For these cases, isolation is determined in essence by matching between pairs of alternate amplifiers ($A_1/A_3$, $A_2/A_4$ ... etc) and quality and matching of the inner most and middle hybrid sets. The corresponding signal flow diagram is shown in FIG. 4. This demonstrates that signal constructive addition occurs at the O/Ps (at points S') of the first hybrid row, with cancellation occurring at the O/Ps of the middle row (at S). Again cancellation can be explained in terms of the introduction of a 2×90° phase shift differential by hybrids either side of an amplifier pair, in this case by hybrids in the middle column. For example in the case of the pair A2/A4 and with the signal applied at input port p1, the relevant hybrids are "E" and "f"

Figure 5:
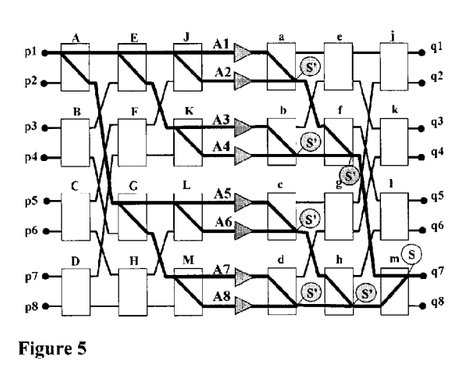
FIG. 5 is a diagram of alternative signal flow in an MPA, showing alternative null signal points for matching of every fourth amplifier.

$\Phi_{71}$ In this case, isolation is determined in essence by matching between every $4^{th}$ amplifier ($A_1/A_6$, $A_2/A_6$ ... etc) and quality and matching of the inner most, middle and outer most hybrid sets, ie all components in the MPA. Signal cancellation for this case occurs at the O/Ps (at point S) of the outer most hybrids as shown in FIG. 5. In this case the 2×90° phase shift is introduced by the outermost hybrid columns. For example in the case of the pair $A_2/A_6$ and with the signal applied at input port p1, the relevant hybrids are "A" and "m"

Figure 6:
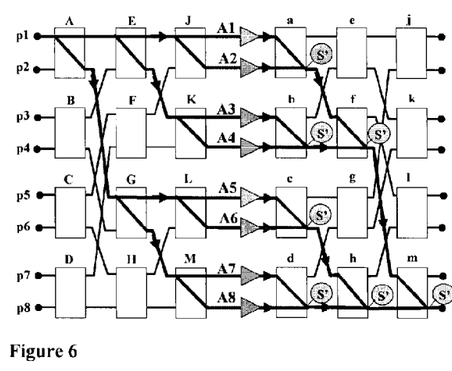
FIG. 6 is a diagram of signal flow in an MPA, for matching of all amplifiers, showing constructive addition of signals.

$\Phi_{81}$ This is associated with the wanted output, and represents the combining loss. It is dependent on matching between all units, but not to the same degree of criticality as for isolation. Constructive addition in this case occurs throughout the output network (at points S') as shown in FIG. 6.

Figure 7:
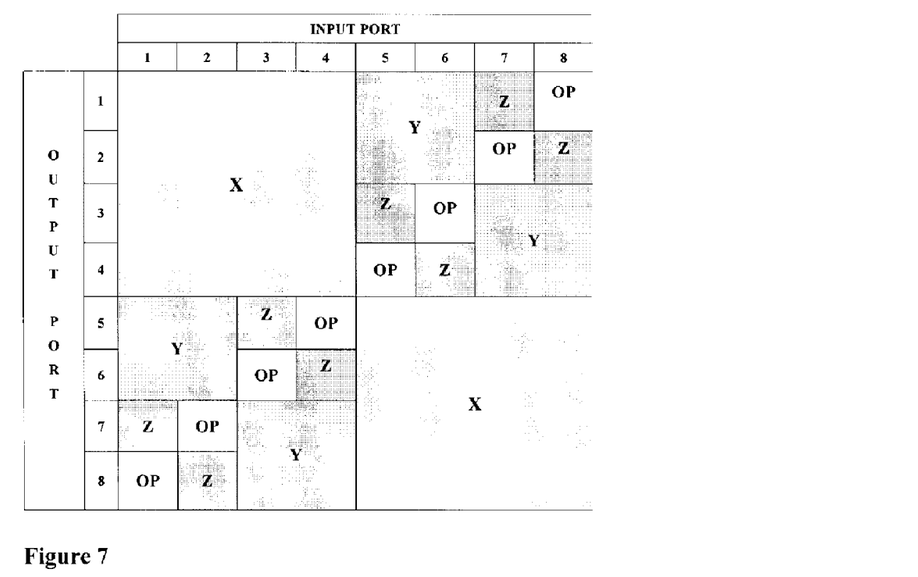
FIG. 7 is a table summarizing the MPA equipments critical in the definition of isolation at each output.

A summary of the MPA equipments critical in the definition of isolation at each O/P is given in FIG. 7. This identifies for each O/P port those equipments which should be matched in order that good isolation is achieved from the signal at the corresponding I/P port. The following key applies to this table
  X: matched adjacent amplifiers (A1/A2, A3/A4) and matched associated inner most hybrids
  Y: matched alternate amplifiers (A1/A3, A2/A4) and matched inner most and middle hybrid sets
  Z: matched $4^{th}$ amplifiers (A1/A5, A2/A6 ... ), matched inner most, middle and outer most hybrid sets The entries "OP" in FIG. 7, designate the wanted O/P port corresponding to a given I/P port.

Isolation is defined here as the ratio of wanted to unwanted signal insertion losses (which includes any combining losses) at a given output port and is defined in terms of the overall MPA transfer matrix $\Phi$ as:

$$I = |\Phi_{(N-n+1),m}|^2 / |\Phi_{(N-n+1),n}|^2 \qquad (17)$$

Where m and n are the input ports of the interfering and wanted signals respectively. (N−n+1) is the output port of the wanted signal, N being the total number of output ports or MPA order, in this case 8, and takes into account the transposition between I/P and O/P port numbering.

An exact expression for isolation can be obtained in terms of individual hybrid and amplifier performance parameters by taking the ratio of the modulus squared of the relevant matrix elements $\Phi_{(N-n+1),m}$ and $\Phi_{(N-n+1),n}$, as defined in Eq. (17).

However the formulae presented below are based on rms value of performance parameters and yield a mean value for isolation. The terms used here include hybrid imperfections.

If the gain and phase deviations of the amplifiers about mean values are represented by $\Delta$ and $\delta$ respectively as in Eq. (7), and hybrid deviations by $\sigma$ and $\theta$ as in Eqs. (4) & (5), then it is assumed that:

$$\sum_{i=1}^{N} \Delta_i = 0, \quad \sum_{i=1}^{N} \delta_i = 0, \quad \sum_{i=1}^{M} \sigma_i = 0, \quad \sum_{i=1}^{M} \theta_i = 0 \qquad (18)$$

Where N is the number of amplifiers, equal to the number of MPA input or output ports, and M=number of hybrids=N log 2N. The mean values of $\Delta$, $\delta$, etc, are then defined by:

$$\bar{\Delta} = \left( \sum_{i=1}^{N} \Delta_i^2 / N \right)^{1/2} \bar{\delta} = \left( \sum_{i=1}^{N} \delta_i^2 / N \right)^{1/2} \ldots \text{etc} \qquad (19)$$

To a first order approximation from Eq. (12) to (16), it can be shown that mean isolation for the 8 port MPA is given in decibels by:

$$Iso = 10 \text{ Log } \{\bar{\epsilon}^2/(8-7\bar{\epsilon}^2)\} dB \qquad (20)$$

Where $\epsilon$ is an rms summation of amplifier and hybrid amplitude/phase deviations. The factors included in this summation depend on which O/P port is under consideration for a given I/P port. These factors may be identified with reference to FIG. 7, and are as follows:

Cases denoted by X:

$$\varepsilon^2 = \bar{\varepsilon}_x^2 = \frac{1}{2} \left( \bar{\Delta}_{adj}^2 + \bar{\delta}_{adj}^2 \right) + \left( \bar{\sigma}_0^2 + \bar{\theta}_0^2 \right) \qquad (21)$$

$\bar{\Delta}_{adj}$, $\bar{\delta}_{adj}$, are respectively the rms amplitude and phase mismatches between paired adjacent amplifiers ($A_1/A_2$, $A_3/A_4$, etc), and $\bar{\sigma}_o$, $\bar{\theta}_o$ correspond to the quality of the inner most hybrid set (ie mean insertion loss differential between O/P ports of a given hybrid, and deviation from 90° between its output ports).

Cases denoted by Y:

$$\varepsilon^2 = \overline{\varepsilon_Y}^2 = \frac{1}{2}\left[\overline{\Delta}_{alt}^2 + \overline{\delta}_{alt}^2\right] + \left[\overline{\sigma}_{adj}^2 + \overline{\theta}_{adj}^2\right] + \frac{1}{2}\left[\overline{\sigma}_0^2 + \theta_0^2\right] \quad (22)$$

Where: $\overline{\Delta}_{alt}$ and $\overline{\delta}_{alt}$ are respectively the rms amplitude and phase mismatches between alternate amplifiers (A1/A3, A2/A4 ... etc), $\overline{\sigma}_{adj}$ and $\theta_{adj}$ are respectively the rms insertion loss and phase mismatches between adjacent hybrids in the innermost set, and $\overline{\sigma}_0$ and $\theta_0$ correspond to the quality of the middle hybrid set (ie mean insertion loss differential between O/P ports of a given hybrid, and deviation from 90° between its output ports).

Cases denoted by Z:

$$\varepsilon^2 = \quad (23)$$
$$\overline{\varepsilon_Z}^2 = \frac{1}{2}\left[\overline{\Delta}_F^2 + \overline{\delta}_F^2\right] + \left[\overline{\sigma}_{alt}^2 + \overline{\theta}_{alt}^2\right] + \frac{1}{2}\left[\overline{\sigma}_{adj}^2 + \overline{\theta}_{adj}^2\right] + \frac{1}{4}\left[\overline{\sigma}_0^2 + \overline{\theta}_0^2\right]$$

Where $\overline{\Delta}_F$ and $\overline{\delta}_F$ are respectively the rms amplitude and phase mismatches between every $4^{th}$ amplifier (A$_1$/A$_5$, A$_2$/A$_6$ ... etc), $\overline{\sigma}_{alt}$ and $\theta_{alt}$ are respectively the rms insertion loss and phase mismatches between alternate hybrids in the innermost set, $\overline{\sigma}_{adj}$ and $\theta_{adj}$ are respectively the rms insertion loss and phase mismatches between adjacent hybrids in the middle set, and $\overline{\sigma}_0$ and $\theta_0$ correspond to the quality of the outer most hybrid set (ie mean insertion loss differential between O/P ports of a given hybrid, and deviation from 90° between its output ports).

In the above equations, the phase and amplitude mismatches are not expressed as individual equipment deviations, but as the differentials between equipments.

The combining loss of the MPA (insertion loss excluding ohmic losses) to a first order of approximation can be shown to be:

$$10\ \text{Log}\left\{1 - \frac{\overline{\varepsilon}_x^2}{2} - \frac{\overline{\varepsilon}_y^2}{4} - \frac{\overline{\varepsilon}_Z^2}{8}\right\}\text{dB} \quad (24)$$

As an example for matching applied to pairs of adjacent amplfiers, with less stringent matching to non paired amplifiers, the following are assumed as practical equipment performances:

The match between paired adjacent amplifiers: 0.7 dB and 5°

The match between non paired amplifiers: 2 dB and 15°

Quality of hybrids: 0.3 dB differential between O/P ports, 5° deviation from 90°

The match between different hybrids: 1 dB and 10°

The following mean isolations are derived for the 3 cases of X, Y and Z as denoted in FIG. 7:

X: 27 dB, Y: 18 dB, Z: 17 dB, Combining loss: 0.30 dB.

Thus an improvement of around 10 dB is obtained for the cases with better matching of paired adjacent amplifiers (Cases denoted by X in FIG. 7). Thus the paired adjacent amplifiers, together with their associated inner most hybrids, may be advantageously packaged as an integrated assembly. In this case each pair in the assembly will advantageously be arranged to run off a common power source. Use of a common power supply for the two amplifiers within an assembly enhances the inherent tracking performance of that assembly. This is particularly advantageous for traveling wave tube amplifiers for which phase tracking is critically dependent on the power supply match between amplifiers.

This arrangement would provide best isolation between signals using ports 1 to 4, and those using ports 5 to 8. Thus in a multi-beam frequency re-use scheme, best isolation may be achieved if, for example in a 4 colour re-use scheme, beam frequency F1 is used only once in the set of ports 1 to 4, and repeated once in ports 5 to 8. Thus the 8 port MPA in this configuration would be ideally suited to a 4 colour re-use scheme with F1, F2, F3 and F4 assigned to ports 1 to 4 and repeated in ports 5 to 8.

Performances less critically dependent on tracking performances include isolation between output ports of different frequency or "colour", and the MPA combining loss. Thus tracking requirements between amplifiers of different self contained assemblies (or phase combined tubes "PCTs", for traveling wave tube amplifiers), may be relaxed resulting in reduced MPA set up and testing time.

With reference to FIG. 7 it can be ascertained that by matching pairs of alternate amplifiers, with less stringent matching between non paired amplifiers, the configuration would also be suited to a 4 colour re-use scheme but with F1 applied to ports 1 & 3, F2 to ports 2 & 4, F3 to ports 5 & 7 and F4 to ports 6 & 8. Similarly with matching of every $4^{th}$ amplifier, the configuration would likewise be suited to a 4 colour re-use scheme with F1 applied to ports 1 & 2, F2 to ports 3 & 4, F3 to ports 5 & 6 and F4 to ports 7 & 8. However in these cases the advantage of paired adjacent amplifiers of being able to integrate the amplifiers plus associated innermost hybrids into a self contained assembly is lost. Moreover in these cases, more hybrid units are brought into the equations defining the isolation (Eq. 22 and 23). Thus assuming the same equipment performances as for the case of paired adjacent amplifiers, but now with the pairing between alternate amplifiers, the mean isolations now become:

X: 20 dB, Y: 21 dB, Z: 17 dB, Combining loss: 0.34 dB.

And for the case in which every $4^{th}$ amplifier is matched, the results are:

X: 20 dB, Y: 18 dB, Z: 20 dB, Combining loss: 0.38 dB.

In comparison with the results above for matched paired alternate and every $4^{th}$ amplifier, the results for matched adjacent amplifiers (X: 27 dB, Y: 18 dB, Z: 17 dB) are significantly better and would be the preferred solution for many applications.

Turning now to MPA intermodulation products (IMPs), these arise from HPA non-linearities, which can be represented by the well-known series expansion:

$$V_{out} = \alpha_1 \cdot V_{in} + \alpha_2 \cdot V_{in} + \alpha_3 \cdot V_{in} \quad (25)$$

Where $V_{in}$ and $V_{out}$ are the HPA input and output signal voltages and $\alpha_1, \alpha_2, \alpha_3, \ldots$, etc are fixed coefficients. In the case of the MPA, the signal set $V_{a1}, V_{a2} \ldots$ at the input to the amplifiers $A_1, A_2, \ldots$ is given by:

$$\begin{bmatrix} V_{a1} \\ \vdots \\ V_{a8} \end{bmatrix} = \Gamma \begin{bmatrix} p_1 \\ \vdots \\ p_s \end{bmatrix} \quad (26)$$

where, $\Gamma$ is the transfer matrix of the input hybrid set (see Eq. (8)), and p1, p2 ... the MPA input signal voltages.

The IMPs $IM_{a1}, IM_{a2}, \ldots$ appearing at each amplifier output are determined from Eq. (25). For a selected intermodulation product (corresponding to the term in Eq. (25)

which is raised to the same power as the product order of interest), the IMPs appearing at the MPA O/Ps, $IM_1$, $IM_2, \ldots$, are given by:

$$\begin{bmatrix} IM_1 \\ \vdots \\ IM_8 \end{bmatrix} = \Omega \begin{bmatrix} IM_{a1} \\ \vdots \\ IM_{a8} \end{bmatrix} \quad (27)$$

where, $IM_{a1}, 1M_{a2} \ldots$, is the selected IMP at the outputs of amplifiers $A_1, A_2 \ldots$ etc, and $\Omega$ is the transfer matrix of the output hybrid set (Eq. (8)).

The following is concluded from the analysis (assuming ideal MPA hybrids, and amplifier tracking):

If more than one carrier is applied to a single I/P port, then all IM products emerge at the corresponding O/P port with no products appearing at any other port.

Figure 8:
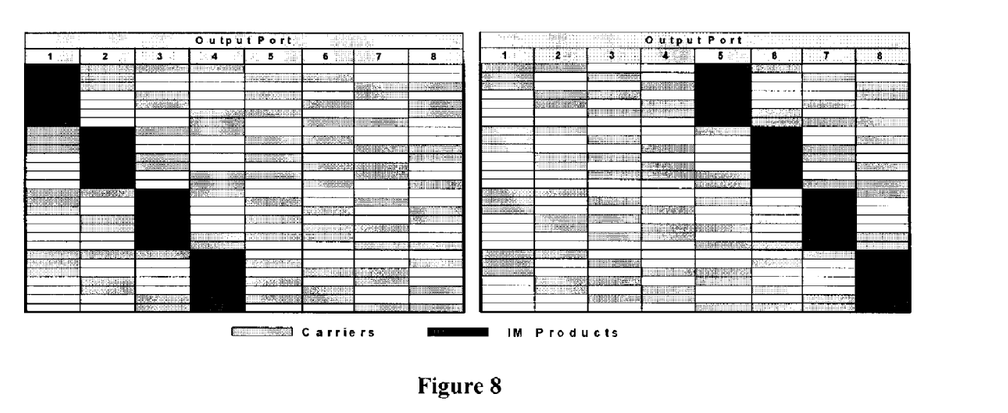
FIG. 8 is a table showing output ports for 3 carrier, $3^{rd}$ order intermodulation products for an 8-port MPA.

If two carriers, of frequency $F_a$ and $F_b$ respectively, are applied to two different I/P ports, then the two carrier, Nth order products (N=m+n, m−n=1, ie $3^{rd}$, $5^{th}$, $7^{th}$ . . . etc) emerge as follows:

the IMP $mF_a$−$nF_b$ emerges at the O/P with $F_b$, if m even but with $F_a$ if m is odd $mF_b$−$nF_a$ emerges at the O/P with $F_a$, if m even but with $F_b$ if m is odd If three carriers $F_a$, $F_b$, $F_c$, are applied to 3 different ports, then the highest level IMPs, ie the three carrier, $3^{rd}$ order products, all emerge at the same output port which is different from any of the wanted signal ports. This is generally in agreement with other analyses, eg. M. Tanaka, Y. Suzuki, "Nonlinear Distortion Analysis of Multiport Amplifier" AIAA, $22^{rd}$ International Communications Satellite Systems Conference, Monterey, May 2004 and is demonstrated in FIG. 8 for the 8 port MPA. This identifies the O/P port from which the 3 carrier IMPs emerge for all 56 combinations of 3 separate input carriers. Identification of the IMP location for these cases may be useful in constructing the frequency plan of a multi-beam payload with the objective of positioning troublesome, high level IMPs away from sensitive traffic.

The invention is especially applicable to Ku and Ka-band MPAs, for which frequencies have correspondingly short wavelengths (0.025 to 0.015 meters). These short wavelengths make it especially difficult, in comparison with L or S band designs (wavelength 0.2 to 0.14 meters) which have been successfully incorporated into payloads, to achieve the required tracking performance. Thus alignment and test time for Ku and Ka band MPAs is longer and more costly, and the use of the invention at these frequencies is therefore more effective.

The invention claimed is:

1. A method of tuning a multiport amplifier, the multiport amplifier comprising an even number of power amplifiers arranged in parallel and each amplifier being paired with another amplifier, a series of input ports and a series of output ports, with the number of input ports and the number of output ports being equal to the number of power amplifiers, the input ports being connected to the amplifiers by a signal dividing network and the output ports being connected to the amplifiers by a signal combining network, whereby an input signal at any given input port is amplified by all amplifiers and then recombined into an output signal at a given output port, the method including the step of matching signal phase and gain of each amplifier to signal phase and gain of its paired amplifier to an extent which is more stringent than said matching between non paired amplifiers.

2. A method of tuning a multiport amplifier as in claim 1, in which the said step of matching each amplifier to its paired amplifier is carried out by matching of amplifiers paired adjacent one another.

3. A method of tuning a multiport amplifier as in claim 2, in which the signal dividing and signal combining networks each include a series of respective signal dividing and signal combining hybrids and in which the step of matching paired amplifiers adjacent one another also includes matching signal phase and insertion losses for respective input and output hybrids in closest connection with each said pair of amplifiers.

4. A method of tuning a multiport amplifier as in claim 3 in which each pair of adjacent amplifiers and the respective input and output hybrids in closest connection therewith comprise a self contained assembly with a common power supply.

5. A method of tuning a multiport amplifier as in claim 1 in which the said step of matching each amplifier to its paired amplifier is carried out by matching of paired alternate amplifiers.

6. A method of tuning a multiport amplifier as in claim 5 in which the signal dividing and signal combining networks each include a series of respective signal dividing and signal combining hybrids and in which the said step of matching paired alternate amplifiers also includes matching signal phase and insertion losses for respective input and output hybrids in both closest connection and next closest connection with each paired amplifier.

7. A method of tuning a multiport amplifier as in claim 1 in which the said step of matching each amplifier to its paired amplifier is carried out by matching of paired amplifiers located four amplifier positions away from one another.

8. A method of tuning a multiport amplifier as in claim 7 in which the signal dividing and signal combining networks each include a series of respective signal dividing and signal combining hybrids and in which the said step of matching amplifiers paired at every 4th position also includes matching signal phase and insertion losses for respective input and output hybrids in the closest connection, the second closest connection and the third closest connection with each paired amplifier.

9. A method of tuning a multiport amplifier as in any preceding claim including the step of matching said signal phase and gain of each amplifier to signal phase and gain of its paired amplifier substantially to within 10 to 15 degrees of signal phase and 1 to 2 dB of gain.

10. A method of tuning a multiport amplifier as in any of claims 1 to 8 including the step of matching said signal phase and gain of each amplifier to signal phase and gain of its paired amplifier substantially to within 7 to 10 degrees of signal phase and 0.7 to 1.0 dB of gain.

11. A method of tuning a multiport amplifier as in any of claims 1 to 8 including the step of matching said signal phase and gain of each amplifier to signal phase and gain of its paired amplifier substantially to within 5 to 7 degrees of signal phase and 0.5 to 0.7 dB of gain.

12. A method of tuning a multiport amplifier as in any of claims 1 to 8 including the step of matching said signal phase and gain of each amplifier to signal phase and gain of its paired amplifier substantially to within less than 5 degrees of signal phase and less than 0.5 dB of gain.

13. A method of tuning a multiport amplifier as in claim 1 including the step of matching of said non paired amplifiers substantially to between 15 to 20 degrees of signal phase and 1.5 to 2.5 dB of gain.

14. A method of tuning a multiport amplifier as in any of claim 3, 4, 6 or 8 including the step of matching all hybrids to at least substantially 10 degrees of signal phase and 1 dB of insertion loss.

15. A method of tuning a multiport amplifier as in claim 3, 4, 6 or 8 including the step of setting deviation from 90 degrees phase difference between hybrid output ports to at least substantially 5 degrees and insertion loss tracking between hybrid input and output ports to at least substantially 0.3 dB.

16. A method of tuning a multiport amplifier as in claim 1 in which the power amplifiers are microwave power amplifiers.

17. A multiport amplifier comprising an even number of power amplifiers arranged in parallel and each amplifier being paired with another amplifier, a series of input ports and a series of output ports, with the number of input ports and the number of output ports being equal to the number of power amplifiers, the input ports being connected to the amplifiers by a signal dividing network and the output ports being connected to the amplifiers by a signal combining network, whereby an input signal at any given input port is amplified by all amplifiers and then recombined into an output signal at a given output port, wherein the signal phase and gain of each amplifier are matched to the signal phase and gain of its paired amplifier to an extent which is more stringent than the extent to which the signal phase and gain of the amplifier are matched to the signal phase and gain of a non-paired amplifier.

18. A multiport amplifier according to claim 17 comprising 8 ports and wherein the signal dividing and combining networks each comprise an 8×8 Butler matrix.

19. A multiport amplifier according to claim 17 in which the signal dividing network includes a series of signal dividing hybrids and the signal combining network includes a series of signal combining hybrids.

20. A multiport amplifier according to claim 19 comprising 8 ports and wherein the signal dividing and combining networks each comprise three columns of hybrids equivalent to a Butler matrix without the inter-hybrid phase shifters.

21. A multiport amplifier in accordance with claim 18, 19 or 20 wherein the first four input ports are each connectable to a different non-overlapping frequency band and the second four input ports are each connected to one of the same four frequency bands.

22. A multiport amplifier in accordance with claim 18, 19 or 20 wherein the first four input ports are alternately connectable to two different non-overlapping frequency bands and the second four input ports are each connected to two different non-overlapping frequency bands with the two frequency bands for the first set of four input ports being different from those of the second set.

23. A multiport amplifier in accordance with claim 18, 19 or 20 wherein pairs of adjacent input ports are connectable to bands of the same frequency, with each pair being connected to one of four different non-overlapping bands of frequency.

24. A satellite payload comprising a single feed per beam multibeam antenna and a multiport amplifier in accordance with claim 21 wherein each output port of the multiport amplifier is connected to a respective antenna feed of the single feed per beam, multi-beam antenna whereby to form a set of beams with frequencies in accordance with a defined frequency re-use pattern.

25. A satellite payload comprising a single feed per beam multibeam antenna and a multiport amplifier in accordance with claim 22 wherein each output port of the multiport amplifier is connected to a respective antenna feed of the single feed per beam, multi-beam antenna whereby to form a set of beams with frequencies in accordance with a defined frequency re-use pattern.

26. A satellite payload comprising a single feed per beam multibeam antenna and a multiport amplifier in accordance with claim 23 wherein each output port of the multiport amplifier is connected to a respective antenna feed of the single feed per beam, multi-beam antenna whereby to form a set of beams with frequencies in accordance with a defined frequency re-use pattern.

27. A multiport amplifier in accordance with claim 17 in which the power amplifiers are microwave power amplifiers.

28. A multiport amplifier according to claim 17, wherein each pair of amplifiers is formed from adjacent amplifiers and wherein each pair of adjacent amplifiers and the respective input and output hybrids in closest connection therewith comprise a self-contained assembly with a common power supply.

* * * * *